(12) United States Patent
Oh et al.

(10) Patent No.: US 11,296,060 B2
(45) Date of Patent: Apr. 5, 2022

(54) LED PIXEL DEVICE HAVING CHIP STACK STRUCTURE

(71) Applicant: LUMENS CO., LTD., Yongin-si (KR)

(72) Inventors: Seunghyun Oh, Yongin-si (KR); Sungsik Jo, Yongin-si (KR); Junghyun Park, Yongin-si (KR); Byeonggeon Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 66 days.

(21) Appl. No.: 16/615,832

(22) PCT Filed: Jun. 4, 2018

(86) PCT No.: PCT/KR2018/006343
§ 371 (c)(1),
(2) Date: Nov. 22, 2019

(87) PCT Pub. No.: WO2019/004622
PCT Pub. Date: Jan. 3, 2019

(65) Prior Publication Data
US 2020/0212017 A1   Jul. 2, 2020

(30) Foreign Application Priority Data
Jun. 26, 2017   (KR) .................. 10-2017-0080399

(51) Int. Cl.
*H01L 25/075* (2006.01)
*H01L 33/62* (2010.01)

(52) U.S. Cl.
CPC .......... *H01L 25/0756* (2013.01); *H01L 33/62* (2013.01); *H01L 2933/0066* (2013.01)

(58) Field of Classification Search
None
See application file for complete search history.

(56) References Cited

U.S. PATENT DOCUMENTS

2012/0256187 A1* 10/2012 Yu ..................... H01L 27/153
257/76
2013/0214300 A1* 8/2013 Lerman .................. F21K 9/64
257/88

(Continued)

FOREIGN PATENT DOCUMENTS

JP   2007-057667 A    3/2007
KR   2005-0120400 A   12/2005
(Continued)

*Primary Examiner* — Khaja Ahmad
(74) *Attorney, Agent, or Firm* — Mei & Mark LLP

(57) ABSTRACT

An LED pixel device is disclosed. The LED pixel device includes a first light-transmitting substrate, a second light-transmitting substrate overlying the first light-transmitting substrate, a third light-transmitting substrate overlying the second light-transmitting substrate, a first light-emitting cell underlying the first light-transmitting substrate, a second light-emitting cell interposed between the first light-transmitting substrate and the second light-transmitting substrate, and a third light-emitting cell interposed between the second light-transmitting substrate and the third light-transmitting substrate. The first light-emitting cell, the second light-emitting cell, and the third light-emitting cell emit light of different wavelengths.

11 Claims, 3 Drawing Sheets

(56) References Cited

U.S. PATENT DOCUMENTS

| | | | | |
|---|---|---|---|---|
| 2015/0360606 A1* | 12/2015 | Thompson | ............... | B60Q 3/54 |
| | | | | 362/490 |
| 2016/0163940 A1* | 6/2016 | Huang | ................ | H01L 25/0756 |
| | | | | 257/89 |
| 2017/0170360 A1* | 6/2017 | Bour | ................... | H01L 33/0008 |
| 2019/0229234 A1* | 7/2019 | Zou | ......................... | H01L 33/38 |

FOREIGN PATENT DOCUMENTS

| | | | | |
|---|---|---|---|---|
| KR | 10-1157579 B1 | 6/2012 | | |
| KR | 2015-0020447 A | 2/2015 | | |
| KR | 2017-0042426 A | 4/2017 | | |
| WO | WO-2018064805 A1 * | 4/2018 | ......... | H01L 25/0753 |

\* cited by examiner

[FIG. 1]
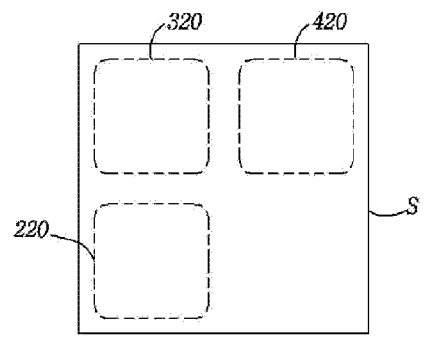
[FIG. 2]
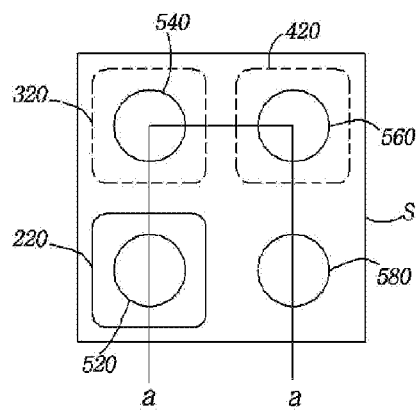

[FIG. 3]
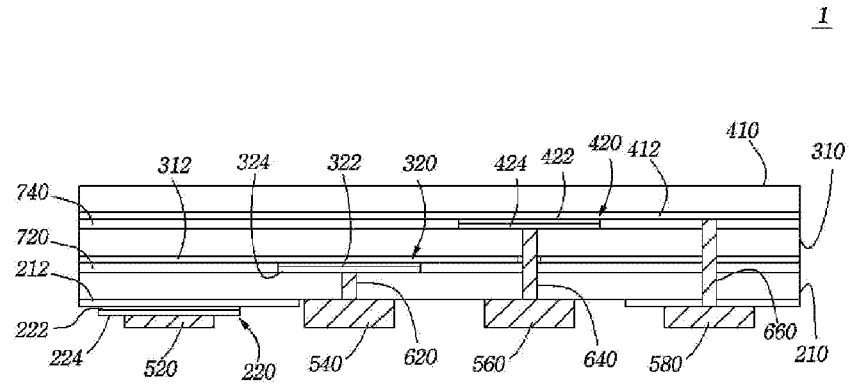
[FIG. 4]
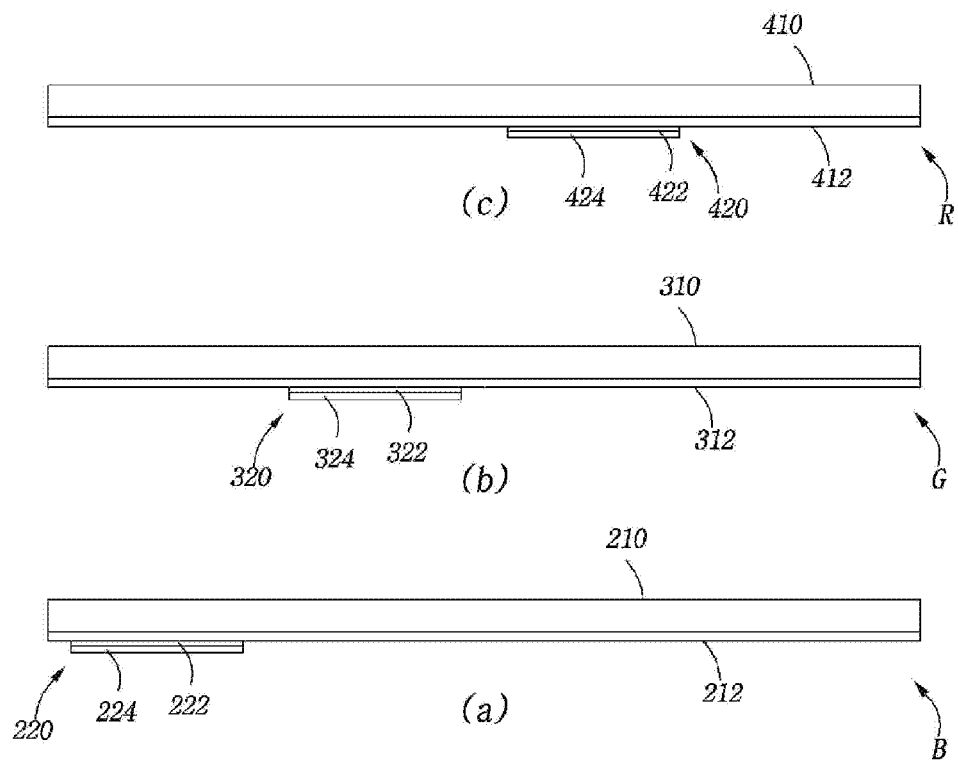

[FIG. 5]
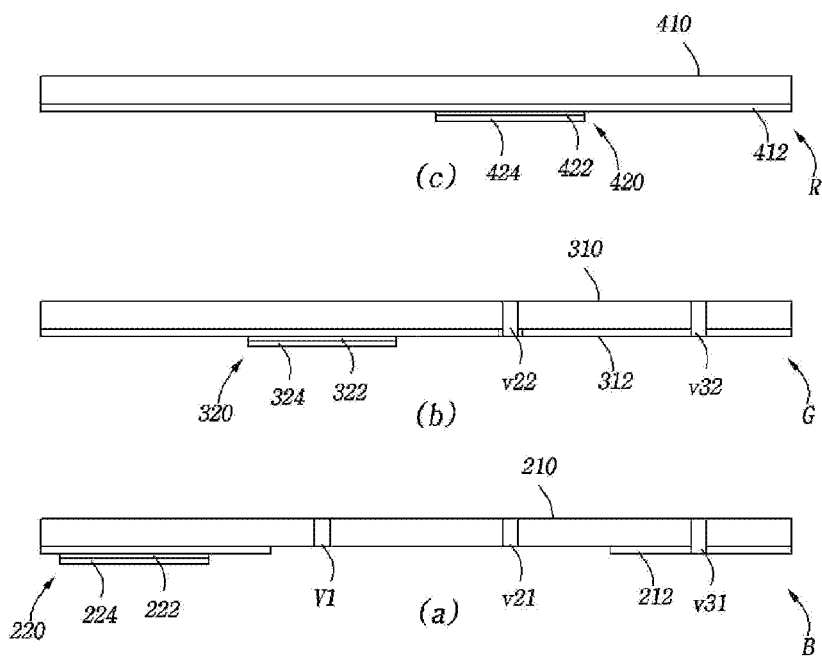
[FIG. 6]
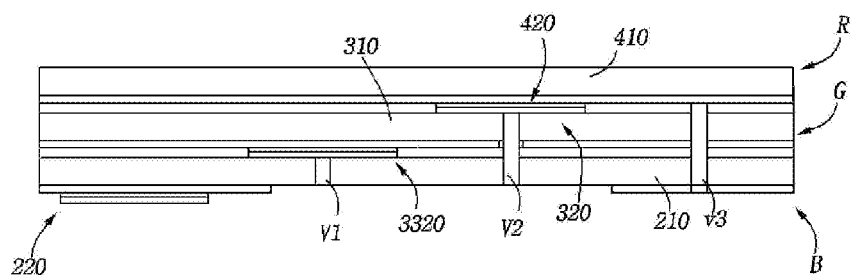

LED PIXEL DEVICE HAVING CHIP STACK STRUCTURE

TECHNICAL FIELD

The present invention relates to an LED pixel device, and more specifically to an LED pixel device having a chip stack structure in which R, G, and B LED chips are stacked into one integrated chip.

BACKGROUND ART

General full-color LED displays include pixels, each consisting of red, green, and blue LEDs. In recent years, LED displays have been proposed in which each pixel consists of red, green, blue, and white LEDs.

Chip-on-module (COM) and PKG-on-module (POM) have been developed to produce RGB light in the manufacture of LED displays. The COM technology uses huge numbers of very small R, G, and B chips, i.e. red, green, and blue LED chips, that need to be bonded. The sizes of the chips make the chip bonding process very difficult and the numbers of the chips disadvantageously lead to low yield. The POM technology requires an additional packaging process and further includes a process for WLP/CSP production. Another problem of the POM technology is that chips are likely to be tilted during the packaging process, which increases the number of defects. Besides these problems, there is a limitation in reducing the size of pixels or sub-pixels. The POM technology has difficulty in reducing the distances between sub-pixels.

DETAILED DESCRIPTION OF THE INVENTION

Problems to be Solved by the Invention

An object of the present invention is to provide an LED pixel device in which chips emitting light beams of different wavelengths are stacked into one integrated chip structure such that the light beams of different wavelengths are emitted through different areas of the upper surface of the chip structure.

Means for Solving the Problems

An LED pixel device according to one aspect of the present invention includes a first light-transmitting substrate, a second light-transmitting substrate overlying the first light-transmitting substrate, a third light-transmitting substrate overlying the second light-transmitting substrate, a first light-emitting cell underlying the first light-transmitting substrate, a second light-emitting cell interposed between the first light-transmitting substrate and the second light-transmitting substrate, and a third light-emitting cell interposed between the second light-transmitting substrate and the third light-transmitting substrate wherein the first light-emitting cell, the second light-emitting cell, and the third light-emitting cell emit light of different wavelengths.

According to one embodiment, the first light-emitting cell, the second light-emitting cell, and the third light-emitting cell are located in different regions when viewed from above.

According to one embodiment, the first light-emitting cell, the second light-emitting cell, and the third light-emitting cell are located at different heights so as not to overlap one another.

According to one embodiment, the first light-transmitting substrate, the second light-transmitting substrate, and the third light-transmitting substrate are formed with a first n layer, a second n layer, and a third n layer, respectively, and the first light-emitting cell, the second light-emitting cell, and the third light-emitting cell include a first p layer, a second p layer, and a third p layer, respectively.

According to one embodiment, the LED pixel device further includes a first electrode pad, a second electrode pad, a third electrode pad, and a fourth electrode pad underlying the first light-transmitting substrate wherein the first p layer is connected to the first electrode pad, the second p layer is connected to the second electrode pad through a first interconnection, the third p layer is connected to the third electrode pad through a second interconnection, and the first n layer, the second n layer, and the third n layer are connected in common to the fourth electrode pad through a third interconnection.

According to one embodiment, at least two of the distances between the central axes of the first electrode pad and the second electrode pad, between the central axes of the second electrode pad and the third electrode pad, and between the central axes of the third electrode pad and the fourth electrode pad are identical.

According to one embodiment, the first interconnection includes a via penetrating the first light-transmitting substrate while being isolated from the first n layer.

According to one embodiment, the second interconnection includes a via sequentially penetrating the second light-transmitting substrate and the first light-transmitting substrate while being isolated from the first n layer and the second n layer.

According to one embodiment, the third interconnection includes a via connected to the first n layer, the second n layer, and the third n layer while penetrating at least the second light-transmitting substrate and the first light-transmitting substrate.

According to one embodiment, the bottom surfaces of the first electrode pad, the second electrode pad, the third electrode pad, and the fourth electrode pad lie in the same plane, the second electrode pad has the same thickness as the third electrode pad, and the first electrode pad and the fourth electrode pad have thicknesses different from those of the second electrode pad and the third electrode pad.

According to one embodiment, the amount of light emitted from the first light-emitting cell is larger than that emitted from the second light-emitting cell.

According to one embodiment, the first light-emitting cell is a blue light-emitting cell, the second light-emitting cell is a green light-emitting cell, and the third light-emitting cell is a red light-emitting cell.

According to one embodiment, the first light-transmitting substrate is a sapphire substrate, the first n layer and the first p layer are portions of a gallium nitride epilayer grown on the sapphire substrate, and a first active layer emitting blue light is formed between the first n layer and the first p layer.

According to one embodiment, the second light-transmitting substrate is a sapphire substrate, the second n layer and the second p layer are portions of a gallium nitride epilayer grown on the sapphire substrate, and a second active layer emitting green light is formed between the second n layer and the second p layer.

According to one embodiment, the third light-transmitting substrate is a light-transmitting carrier substrate, the third n layer and the third p layer are portions of a gallium arsenide epilayer bonded to the light-transmitting carrier substrate, and a third active layer emitting red light is formed between the third n layer and the third p layer. According to one embodiment, the LED pixel device further includes a first electrode pad connected to a first electrical polarity of the first light-emitting cell, a second electrode pad connected to a first electrical polarity of the second light-emitting cell, a third electrode pad connected to a first electrical polarity of the third light-emitting cell, and a fourth electrode pad connected in common to second electrical polarities of the first light-emitting cell, the second light-emitting cell, and the third light-emitting cell.

According to one embodiment, the first electrode pad, the second electrode pad, the third electrode pad, and the fourth electrode pad underlie the first light-transmitting substrate.

Effects of the Invention

The LED pixel device of the present invention has a chip structure in which chips emitting light beams of different wavelengths are stacked into one integrated chip. Therefore, the LED pixel device of the present invention can emit the light beams of different wavelengths through different areas of the upper surface of the chip structure.

BRIEF DESCRIPTION OF THE DRAWINGS

FIG. 1 is a plan view illustrating an LED pixel device according to one embodiment of the present invention.

FIG. 2 is a bottom view illustrating an LED pixel device according to one embodiment of the present invention.

FIG. 3 is a cross-sectional view taken along line a-a of FIG. 2.

FIGS. 4 to 6 illustrate a method for fabricating an LED pixel device according to one embodiment of the present invention.

BEST MODE FOR CARRYING OUT THE INVENTION

Preferred embodiments of the present invention will now be described with reference to the accompanying drawings.

FIG. 1 is a plan view illustrating an LED pixel device according to one embodiment of the present invention, FIG. 2 is a bottom view illustrating an LED pixel device according to one embodiment of the present invention, FIG. 3 is a cross-sectional view taken along line a-a of FIG. 2, and FIGS. 4 to 6 illustrate a method for fabricating an LED pixel device according to one embodiment of the present invention.

Referring to FIGS. 1 and 2, an LED pixel device 1 according to one embodiment of the present invention includes: a stack S of light-transmitting substrates; and a first light-emitting cell 220, a second light-emitting cell 320, and a third light-emitting cell 420 located in different regions of the stack S when viewed from the top or bottom of the stack S. When the LED pixel device 1 is applied to a display, the first light-emitting cell 220, the second light-emitting cell 320, and the third light-emitting cell 420 serve as sub-pixels and are combined into one pixel.

The stack S consists of a plurality of light-transmitting substrates spaced apart from and parallel to one another in the vertical direction. Specifically, the stack S includes a first light-transmitting substrate 210, a second light-transmitting substrate 310, and a third light-transmitting substrate 410.

The second light-transmitting substrate 310 has the same planar shape and area as the first light-transmitting substrate 210 and overlies the first light-transmitting substrate 210. The third light-transmitting substrate 410 has the same planar shape and area as the second light-transmitting substrate 310 and overlies the second light-transmitting substrate 310.

A first n layer 212 is formed on the bottom surface of the first light-transmitting substrate 210. The first light-emitting cell 220 is disposed in an area on the first n layer 212 and includes a first active layer 222 and a first p layer 224.

The first light-transmitting substrate 210 is preferably a sapphire substrate. The first n layer 212, the first active layer 222, and the first p layer 224 are preferably portions of a gallium nitride epilayer grown on the sapphire substrate. The first active layer 222 is preferably formed between the first n layer 212 and the first p layer 224 to emit blue light.

Most preferably, the first light-emitting cell 220 is produced by growing an n-type semiconductor layer, an active layer, and a p-type semiconductor layer on a sapphire substrate as the first light-transmitting substrate 210 and section-wise etching the p-type semiconductor layer and the active layer. As a result, the first light-emitting cell 220 has a structure in which the n-type semiconductor layer is formed as the first n layer 212 on the first light-transmitting substrate 210, the active layer including MQWs is formed as the first active layer 222 on the first n layer 212, and the p-type semiconductor layer is formed as the first p layer 224 on the first active layer 222.

Herein, it is to be noted that the terms "n layer" and "p layer" are not limited to particular conductive semiconductor layers and mean layers having opposite conductivities. That is to say, in the most preferred embodiment of the present invention, the n layer is an n-type semiconductor layer and the p layer is a p-type semiconductor layer. Indeed, the n layer and the p layer may be a p-type semiconductor layer and an n-type semiconductor layer, respectively. Alternatively, the n layer or the p layer may be a metal layer or another conductive layer connected to an n-type or p-type semiconductor layer.

A second n layer 312 is formed on the bottom surface of the second light-transmitting substrate 310. The second light-emitting cell 320 is disposed in an area on the second n layer 312 and includes a second active layer 322 and a second p layer 324. Preferably, the second light-transmitting substrate 310 is a sapphire substrate. The second n layer 312, the second active layer 322, and the second p layer 324 are preferably portions of a gallium nitride epilayer grown on the sapphire substrate. The second active layer 322 is preferably formed between the second n layer 312 and the second p layer 324 to emit green light. Most preferably, the second light-emitting cell 320 is produced by growing an n-type semiconductor layer, an active layer, and a p-type semiconductor layer on a sapphire substrate as the second light-transmitting substrate 310 and section-wise etching the p-type semiconductor layer and the active layer. As a result, the second light-emitting cell 320 has a structure in which the n-type semiconductor layer is formed as the second n layer 312 on the second light-transmitting substrate 310, the active layer including MQWs is formed as the second active layer 322 on the second n layer 312, and the p-type semiconductor layer is formed as the second p layer 324 on the second active layer 322.

A third n layer 412 is formed on the bottom surface of the third light-transmitting substrate 410. The third light-emitting cell 420 is disposed in an area on the third n layer 412 and includes a third active layer 422 and a third p layer 424. Preferably, the third light-transmitting substrate 410 is a light-transmitting carrier substrate. The third n layer 412 and the third p layer 424 are preferably portions of a gallium arsenide epilayer bonded to the light-transmitting carrier substrate 410. The third active layer 422 is preferably formed between the third n layer 412 and the third p layer 424 to emit red light.

The LED pixel device 1 further includes a first electrode pad 520, a second electrode pad 540, a third electrode pad 560, and a fourth electrode pad 580 underlying the first light-transmitting substrate 210.

The first electrode pad 520 may be directly connected to the first p layer 224 of the first light-emitting cell 220 without any interconnection. The second p layer 324 of the second light-emitting cell 320 is connected to the second electrode pad 540 through a first interconnection 620. The third p layer 424 of the third light-emitting cell 420 is connected to the third electrode pad 560 through a second interconnection 640. Particularly, the first n layer 212, the second n layer 312, and the third n layer 412 are connected in common to the fourth electrode pad 580 through a third interconnection 660. That is, Accordingly, the first electrode pad 520, the second electrode pad 540, and the third electrode pad 560 serve as individual electrode pads that are connected to the first p layer 224 of the first light-emitting cell 220, the second p layer 324 of the second light-emitting cell 320, and the third p layer 424 of the third light-emitting cell 420, respectively, and the fourth electrode pad 580 serves as a common electrode pad that is connected in common to the first n layer 212 of the first light-emitting cell 220, the second n layer 312 of the second light-emitting cell 320, and the third n layer 412 of the third light-emitting cell 420.

The first interconnection 620 includes a first via 620 made of a metal that penetrates the first light-transmitting substrate 210 while being electrically isolated from the first n layer 212. One end of the first via 620 is in contact with the second p layer 324 of the second light-emitting cell 320 and the other end thereof is in contact with the second electrode pad 540. For isolation between the first via 620 and the first n layer 212, a portion of the first n layer 212 may be removed from the first light-transmitting substrate 210. Alternatively, it is contemplated that an insulating cover layer may be used to electrically isolate the first via 620 from the first n layer 212.

The second interconnection 640 includes a second via 640 made of a metal that sequentially penetrates the second light-transmitting substrate 310 and the first light-transmitting substrate 210 while being electrically isolated from the first n layer 212 and the second n layer 312. One end of the second via 640 is in contact with the third p layer 424 of the third light-emitting cell 420 and the other end thereof is in contact with the third electrode pad 560. For isolation between the second via 640 and the first n layer 212, a portion of the first n layer 212 may be removed from the first light-transmitting substrate 210. For isolation between the second via 640 and the second n layer 312, a portion of the second n layer 312 may be removed from the second light-transmitting substrate 310. Alternatively, it is contemplated that an insulating cover layer may be used to electrically isolate the second via 640 from the first n layer 212 and the second n layer 312.

The third interconnection 660 includes a third via 660 that is connected to the first n layer 212, the second n layer 312, and the third n layer 412 while sequentially penetrating at least the second light-transmitting substrate 310 and the first light-transmitting substrate 210. One end of the third via 660 is in contact with the third n layer 412 and penetrates the first n layer 212 and the second n layer 312 while being in contact with the first n layer 212 and the second n layer 312. The other end of the third via 660 is in contact with the fourth electrode pad 580. The first n layer 212, the second n layer 312, and the third n layer 412 are connected in common to the third via 660 connected to the fourth electrode pad 580. Thus, the fourth electrode pad 580 serves as a common electrode pad.

The bottom surfaces of the first electrode pad 520, the second electrode pad 540, the third electrode pad 560, and the fourth electrode pad 580 are preferably coplanar for bonding to an external substrate. To this end, the thickness of the first electrode pad 520 is made smaller than the thicknesses of the second electrode pad 540, the third electrode pad 560, and the fourth electrode pad 580.

Light from the first light-emitting cell 220 is emitted to the outside through the first light-transmitting substrate 210, the second light-transmitting substrate 310, and the third light-transmitting substrate 410, whereas light from the second light-emitting cell 320 is emitted to the outside through the second light-transmitting substrate 310 and the third light-transmitting substrate 410. Accordingly, light from the first light-emitting cell 220 undergoes a more significant loss than light from the second light-emitting cell 320. In view of this, it is preferable that the amount of light emitted from the first light-emitting cell 220 is larger than that emitted from the second light-emitting cell 320. It is preferred that a gallium nitride blue light-emitting cell emitting a relatively large amount of light and a gallium nitride green light-emitting cell emitting a relatively small amount of light are used as the first light-emitting cell 220 and the second light-emitting cell 320, respectively. The third light-emitting cell 420 is preferably a red light-emitting cell.

Since the second light-emitting cell 320 is present between the first light-transmitting substrate 210 and the second light-transmitting substrate 310, the first light-transmitting substrate 210 and the second light-transmitting substrate 310 are separated by a gap having a thickness corresponding to the thickness of the second light-emitting cell 320. This gap is filled by a first insulating cover layer 720. Since the third light-emitting cell 420 is present between the second light-transmitting substrate 310 and the third light-transmitting substrate 410, the second light-transmitting substrate 310 and the third light-transmitting substrate 410 are separated by a gap having a thickness corresponding to the thickness of the third light-emitting cell 420. This gap is filled by a second insulating cover layer 740.

Here, the third light-transmitting substrate 410 may be omitted. Furthermore, it is contemplated that one of the first, second, and third light-transmitting substrates 210, 310, and 410 may be omitted.

Referring now to FIGS. 4 to 7, a description will be given of a method for fabricating the LED pixel device.

First, a first LED wafer B, a second LED wafer G, and a third LED wafer R are constructed, as illustrated in (a), (b), and (c) of FIG. 4.

As illustrated in (a) of FIG. 4, the first LED wafer B includes a first light-transmitting substrate 210, a first n layer 212 formed on one surface (bottom surface) of the first light-transmitting substrate 210, and a plurality of first light-emitting cells 220 (only one of them is illustrated here) disposed on the first n layer 212. The first light-transmitting substrate 210 is a sapphire substrate and the first n layer 212 is an n-type gallium nitride semiconductor layer. Each of the first light-emitting cells 220 includes a first active layer 222 and a first p layer 224. The first active layer 222 is a gallium nitride semiconductor layer including MQWs and the first p layer 224 is an n-type gallium nitride semiconductor layer. The first LED wafer B is constructed by sequentially growing the first n layer 212, the first active layer 222, and the first p layer 224 on the first light-transmitting substrate 210 and section-wise etching the first active layer 222 and the first p layer 224 to produce the plurality of first light-emitting cells 220.

As illustrated in (b) of FIG. 4, the second LED wafer G includes a second light-transmitting substrate 310, a second n layer 312 formed on one surface (bottom surface) of the second light-transmitting substrate 310, and a plurality of second light-emitting cells 320 (only one of them is illustrated here) disposed on the second n layer 312. The second light-transmitting substrate 310 is a sapphire substrate and the second n layer 312 is an n-type gallium nitride semiconductor layer. Each of the second light-emitting cells 320 includes a second active layer 322 and a second p layer 324. The second active layer 322 is a gallium nitride semiconductor layer including MQWs and the second p layer 324 is an n-type gallium nitride semiconductor layer. The second LED wafer G is constructed by sequentially growing the second n layer 312, the second active layer 322, and the second p layer 324 on the second light-transmitting substrate 310 and section-wise etching the second active layer 322 and the second p layer 324 to form the plurality of second light-emitting cells 320.

As illustrated in (c) of FIG. 4, the third LED wafer R includes a third light-transmitting substrate 410, a third n layer 412 bonded to one surface (bottom surface) of the third light-transmitting substrate 410, and a plurality of third light-emitting cells 420 (only one of them is illustrated here) disposed on the third n layer 412. The third light-transmitting substrate 410 is a sapphire substrate and the third n layer 412 is an n-type gallium arsenide semiconductor layer. Each of the third light-emitting cells 420 includes a third active layer 422 and a third p layer 424. The third p layer 424 is an n-type gallium nitride semiconductor layer.

Referring then to FIG. 5, via holes are formed in the first LED wafer B, the second LED wafer G, and the third LED wafer R. The first n layer 212 of the first LED wafer B and the second n layer 312 of the second LED wafer G are patterned. This patterning is performed to electrically isolate a first via 620 (see FIG. 3) and a second via 640 (see FIG. 3) from the corresponding n layers.

As illustrated in (a) of FIG. 5, a first via hole v1, a 2-$1^{st}$ via hole v21, and a 3-$1^{st}$ via hole v31 are formed so as to penetrate the first light-transmitting substrate 210. The first via hole v1 and the 2-$1^{st}$ via hole v21 are formed in a portion of the first n layer 212 removed by the patterning and the 3-$1^{st}$ via hole v31 is formed in a portion of the first n layer 212 remaining unremoved so as to penetrate the first n layer 212.

As illustrated in (b) of FIG. 5, a 2-$2^{nd}$ via hole v22 and a 3-$2^{nd}$ via hole v32 are formed so as to penetrate the second light-transmitting substrate 310. The 2-$2^{nd}$ via hole v22 is formed in a portion of the second n layer 312 removed by the patterning and the 3-$2^{nd}$ via hole v32 is formed in a portion of the second n layer 312 remaining unremoved so as to penetrate the second n layer 312.

As illustrated in (c) of FIG. 5, a 3-$3^{rd}$ via hole v33 is formed so as to penetrate the third light-transmitting substrate 410 and the third n layer 412.

Referring to FIG. 6, the first LED wafer B, the second LED wafer G, and the third LED wafer R are stacked such that the first via hole v1 meets the second light-emitting cell 320, the 2-$1^{st}$ via hole v21 (see FIG. 5) and the 2-$2^{nd}$ via hole v22 (see FIG. 5) are connected to each other to form a second via hole v2, the second via hole v2 comes into contact with the third light-emitting cell 420, and the 3-$1^{st}$ via hole v31 (see FIG. 5), the 3-$2^{nd}$ via hole v32 (see FIG. 5), and the 3-$3^{rd}$ via hole v33 (see FIG. 5) are connected together to form a third via hole v3.

Next, the first via 620 (see FIG. 3), the second via 640 (see FIG. 3), and the third via 660 (see FIG. 3) are formed in the first via hole v1, the second via hole v2, and the third via hole v3, respectively, and a first electrode pad 520, a second electrode pad 540, a third electrode pad 560, and a fourth electrode pad 580 are disposed in contact with the bottom surface of the first light-emitting cell 220, the first via 620 (see FIG. 3), the second via 640 (see FIG. 3), and the third via 660 (see FIG. 3), respectively.

In the resulting LED wafer structure, the plurality of first light-emitting cells 220, the plurality of second light-emitting cells 320, and the plurality of third light-emitting cells 420 are disposed in groups. Specifically, the first light-emitting cells 220 underlies the first light-transmitting substrate 210, the second light-emitting cells 320 are interposed between the first light-transmitting substrate 210 and the second light-transmitting substrate 310, and the third light-emitting cells 420 are interposed between the second light-transmitting substrate 310 and the third light-transmitting substrate 410. The LED wafer structure is singulated into individual LED pixel devices illustrated in FIGS. 1 to 3.

EXPLANATION OF REFERENCE NUMERALS

210 . . . First light-transmitting substrate
310 . . . Second light-transmitting substrate
410 . . . Third light-transmitting substrate
220 . . . First light-emitting cell
320 . . . Second light-emitting cell
420 . . . Third light-emitting cell

The invention claimed is:
1. An LED pixel device comprising a first light-transmitting substrate, a second light-transmitting substrate overlying the first light-transmitting substrate, a third light-transmitting substrate overlying the second light-transmitting substrate, a first light-emitting cell underlying the first light-transmitting substrate, a second light-emitting cell interposed between the first light-transmitting substrate and the second light-transmitting substrate, and a third light-emitting cell interposed between the second light-transmitting substrate and the third light-transmitting substrate wherein the first light-emitting cell, the second light-emitting cell, and the third light-emitting cell emit light of different wavelengths,
  wherein the first light-transmitting substrate, the second light-transmitting substrate, and the third light-transmitting substrate comprise a first n layer, a second n layer, and a third n layer, respectively, and the first light-emitting cell, the second light-emitting cell, and the third light-emitting cell comprise a first p layer, a second p layer, and a third p layer, respectively,
  wherein the LED pixel device further comprises a first electrode pad, a second electrode pad, a third electrode pad, and a fourth electrode pad underlying the first light-transmitting substrate,
  wherein the first p layer is directly connected to the first electrode pad, the second p layer is connected to the second electrode pad through a first interconnection, the third p layer is connected to the third electrode pad through a second interconnection, the first n layer is directly connected to the fourth electrode pad, and the second n layer and the third n layer are connected in common to the fourth electrode pad through a third interconnection, wherein the bottom surfaces of the first electrode pad, the second electrode pad, the third electrode pad, and the fourth electrode pad lie in the same plane, the second electrode pad has the same thickness as the third electrode pad, and the first electrode pad and the fourth electrode pad have thicknesses different from those of the second electrode pad and the third electrode pad, and wherein the amount of light emitted from the first light-emitting cell is larger than that emitted from the second light-emitting cell.

2. The LED pixel device according to claim 1, wherein the first light-emitting cell, the second light-emitting cell, and the third light-emitting cell are located in different regions when viewed from above.

3. The LED pixel device according to claim 1, wherein the first light-emitting cell, the second light-emitting cell, and the third light-emitting cell are located at different heights so as not to overlap one another.

4. The LED pixel device according to claim 1, wherein at least two of the distances between the central axes of the first electrode pad and the second electrode pad, between the central axes of the second electrode pad and the third electrode pad, and between the central axes of the third electrode pad and the fourth electrode pad are identical.

5. The LED pixel device according to claim 1, wherein the first interconnection comprises a via penetrating the first light-transmitting substrate while being isolated from the first n layer.

6. The LED pixel device according to claim 1, wherein the second interconnection comprises a via sequentially penetrating the second light-transmitting substrate and the first light-transmitting substrate while being isolated from the first n layer and the second n layer.

7. The LED pixel device according to claim 1, wherein the third interconnection comprises a via connected to the first n layer, the second n layer, and the third n layer while penetrating at least the second light-transmitting substrate and the first light-transmitting substrate.

8. The LED pixel device according to claim 1, wherein the first light-emitting cell is a blue light-emitting cell, the second light-emitting cell is a green light-emitting cell, and the third light-emitting cell is a red light-emitting cell.

9. The LED pixel device according to claim 1, wherein the first light-transmitting substrate is a sapphire substrate, the first n layer and the first p layer are portions of a gallium nitride epilayer grown on the sapphire substrate, and a first active layer emitting blue light is formed between the first n layer and the first p layer.

10. The LED pixel device according to claim 1, wherein the second light-transmitting substrate is a sapphire substrate, the second n layer and the second p layer are portions of a gallium nitride epilayer grown on the sapphire substrate, and a second active layer emitting green light is formed between the second n layer and the second p layer.

11. The LED pixel device according to claim 1, wherein the third light-transmitting substrate is a light-transmitting carrier substrate, the third n layer and the third p layer are portions of a gallium arsenide epilayer bonded to the light-transmitting carrier substrate, and a third active layer emitting red light is formed between the third n layer and the third p layer.

* * * * *